(12) United States Patent
DeKam et al.

(10) Patent No.: US 11,199,456 B2
(45) Date of Patent: Dec. 14, 2021

(54) TEMPERATURE SENSORS

(71) Applicant: HEWLETT-PACKARD DEVELOPMENT COMPANY, L.P., Spring, TX (US)

(72) Inventors: Kevin P DeKam, Corvallis, OR (US); Timothy L Weber, Corvallis, OR (US); Sterling Chaffins, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 342 days.

(21) Appl. No.: 16/324,958

(22) PCT Filed: Oct. 25, 2016

(86) PCT No.: PCT/US2016/058608
§ 371 (c)(1),
(2) Date: Feb. 12, 2019

(87) PCT Pub. No.: WO2018/080441
PCT Pub. Date: May 3, 2018

(65) Prior Publication Data
US 2019/0242758 A1     Aug. 8, 2019

(51) Int. Cl.
*G01K 7/22* (2006.01)
*B33Y 10/00* (2015.01)
(Continued)

(52) U.S. Cl.
CPC ............... *G01K 7/223* (2013.01); *B22F 7/08* (2013.01); *B29C 64/153* (2017.08); *B33Y 10/00* (2014.12);
(Continued)

(58) Field of Classification Search
CPC ...... H01C 1/1406; H01C 7/027; H01C 7/003; H01C 17/06526; H01C 17/06553; G01K 7/223; G01K 7/226; B33Y 10/00
See application file for complete search history.

(56) References Cited

U.S. PATENT DOCUMENTS 5,017,954 A   5/1991   Harvey
5,793,276 A   8/1998   Tosaka et al.
(Continued)

FOREIGN PATENT DOCUMENTS

CN   1150314   5/1997
CN   1259745   7/2000
(Continued)

OTHER PUBLICATIONS

Hou, S et al., 3D Printing of Structures with Embedded Circuit Boards Using Novel Holographic Optics, May 28-31, 2013, < http://ieeexplore.ieee.org/xpls/abs_all.jsp?arnumber=6575611 &tag=1 >.

*Primary Examiner* — Kyung S Lee
(74) *Attorney, Agent, or Firm* — Thorpe, North & Western LLP

(57) ABSTRACT

A temperature sensor can include a resistor, a first electrical contact at a first end of the resistor, a second electrical contact at a second end of the resistor, and a resistance measuring device. The resistor can be formed of a matrix of sintered elemental transition metal particles interlocked with a matrix of fused thermoplastic polymer particles. The resistance measuring device can be connected to the first electrical contact and the second electrical contact to measure a resistance of the resistor.

15 Claims, 5 Drawing Sheets

(51) Int. Cl.

| | |
|---|---|
| *H01C 7/02* | (2006.01) |
| *H01C 17/065* | (2006.01) |
| *B33Y 80/00* | (2015.01) |
| *B29C 64/153* | (2017.01) |
| *G01K 7/16* | (2006.01) |
| *B33Y 70/00* | (2020.01) |
| *H01C 3/12* | (2006.01) |
| *B22F 7/08* | (2006.01) |
| *H01C 1/14* | (2006.01) |
| *H01C 7/00* | (2006.01) |
| *B29L 31/34* | (2006.01) |
| *B22F 10/20* | (2021.01) |

(52) U.S. Cl.
CPC ............... *B33Y 70/00* (2014.12); *B33Y 80/00* (2014.12); *G01K 7/16* (2013.01); *G01K 7/226* (2013.01); *H01C 1/1406* (2013.01); *H01C 3/12* (2013.01); *H01C 7/003* (2013.01); *H01C 7/027* (2013.01); *H01C 17/06526* (2013.01); *H01C 17/06553* (2013.01); *H01C 17/06586* (2013.01); *B22F 10/20* (2021.01); *B29L 2031/3487* (2013.01)

(56) References Cited

U.S. PATENT DOCUMENTS

| | | | |
|---|---|---|---|
| 6,778,062 B2 | 8/2004 | Handa et al. | |
| 10,839,992 B1 * | 11/2020 | Klek | ................. H01C 17/2416 |
| 2003/0091829 A1 * | 5/2003 | Handa | ..................... C08K 3/08 |
| | | | 428/413 |
| 2010/0079234 A1 * | 4/2010 | Chen | ................ H01C 17/06586 |
| | | | 338/22 R |
| 2011/0169375 A1 | 7/2011 | Helvajian et al. | |
| 2012/0111599 A1 * | 5/2012 | Roberson | ............... B82Y 30/00 |
| | | | 174/107 |
| 2013/0009338 A1 | 1/2013 | Mayer | |
| 2014/0070461 A1 | 3/2014 | Pax | |
| 2015/0352785 A1 * | 12/2015 | Folgar | ...................... B22F 7/08 |
| | | | 428/201 |
| 2016/0007474 A1 * | 1/2016 | Dardona | .................. H05B 3/06 |
| | | | 219/543 |
| 2017/0252974 A1 * | 9/2017 | Ng | .......................... B22F 10/10 |

FOREIGN PATENT DOCUMENTS

| | | |
|---|---|---|
| CN | 1461016 | 12/2003 |
| CN | 1183557 | 1/2005 |
| CN | 101516980 | 8/2009 |
| CN | 101652645 | 2/2010 |
| CN | 102176361 | 9/2011 |
| CN | 102598162 | 7/2012 |
| EP | 0747910 | 12/1996 |
| EP | 2963995 | 6/2016 |
| JP | H07263202 | 10/1995 |
| WO | WO-2008083926 | 7/2008 |
| WO | WO-2014200595 | 12/2014 |
| WO | WO-2016068899 A1 | 5/2016 |

* cited by examiner

TEMPERATURE SENSORS

BACKGROUND

Certain types of temperature sensors can measure temperatures based on changes in electrical resistance of a material. The material is often referred to as a "thermistor" or thermally sensitive resistor. Thermistors are often made of a semiconducting material such as metal oxides or silicon. Depending on the material, a thermistor can have a positive or negative temperature coefficient. In positive temperature coefficient thermistors, the resistance of the material increases as temperature rises. Conversely, in a negative temperature coefficient thermistor, the resistance of the material decreases as temperature rises. Thermistors can be used in applications such as temperature sensors, current limiters in electrical circuits, self-regulating heating elements, and so on. A typical thermistor can include a thermistor chip made of the temperature sensitive material, wires leading to two sides of the thermistor chip, and an insulating bead encapsulating the thermistor chip.

Figure 1:
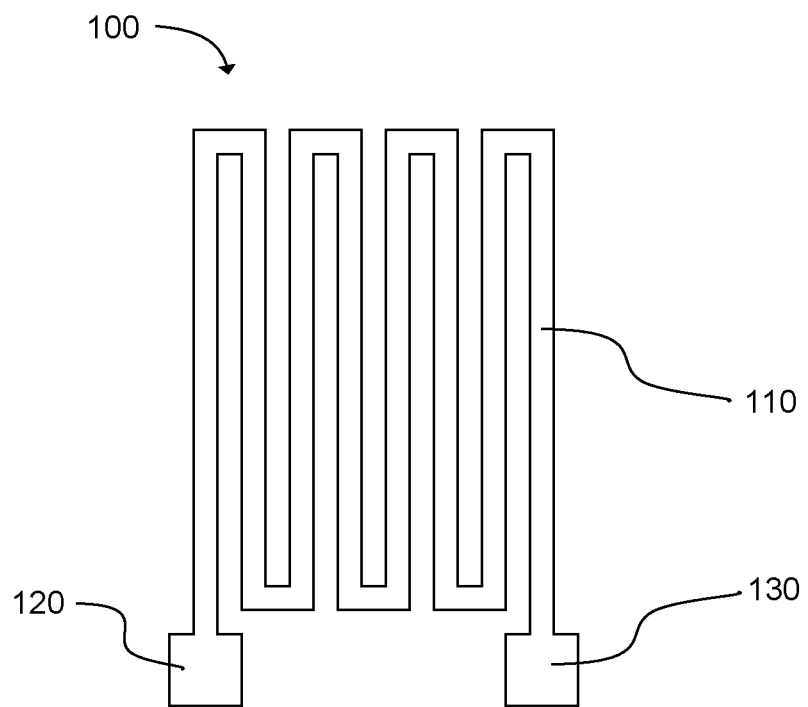
FIG. 1 is a top plan view of a 3-dimensional printed temperature sensor in accordance with examples of the present disclosure.

The figures depict several examples of the presently disclosed technology. However, it should be understood that the present technology is not limited to the examples depicted.

DETAILED DESCRIPTION

The present disclosure is drawn to the area of temperature sensors and 3D printing. More specifically, the present disclosure provides 3-dimensional printed temperature sensors, 3-dimensional printed parts with integrated temperature sensors, and methods of printing the parts.

Thermistors are typically discrete components that can be connected to a circuit by soldering, such as on a printed circuit board. In contrast, the present technology provides thermally sensitive resistors that can be embedded as a part of a 3-dimensional printed part. By eliminating the thermistor as a separate component, the complexity and cost of a system using the thermistor can be reduced. Potential cost efficiencies include the elimination of manufacturing steps and material costs. The present technology can also improve reliability and durability of systems by reducing instances of failure due to damage or separation of a thermistor. Integrating temperature sensors as a part of 3-dimensional printed objects also allows for measuring of internal temperatures at any internal location in the part. This can provide advantages over surface mounted temperature sensors, which measure temperature on the surface where the sensor is attached. Additionally, installing sensors internally in an object is normally accomplished by drilling a hole or otherwise forming a void space within the object into which a sensor is inserted. Such modifications of the object can impair surface finish or weaken the structural integrity of the object. In contrast, the temperature sensors described herein can be an integral part of a 3-dimensional printed object. Thus, the temperature sensors can be formed at any internal location in the object without substantially weakening the object.

In some examples of the present technology, 3-dimensional printed parts with integrated temperature sensors can be formed using a process involving a powder bed of thermoplastic polymer particles, a conductive fusing agent composition, and a second fusing agent composition. In this process, a thin layer of polymer powder is spread to form a powder bed. A printing head, such as an inkjet print head, is then used to print fusing agent compositions over portions of the powder bed corresponding to a thin layer of the three dimensional object to be formed. With each layer, a conductive fusing agent composition can be printed in areas where a conductive resistor for the temperature sensor is desired to be formed, and a second fusing agent composition can be printed in other areas. The bed can then be exposed to a radiation source, e.g., typically the entire bed. The fusing agent compositions absorb more energy from the radiation source than the unprinted powder. The absorbed radiation can then be converted to thermal energy, causing the printed portions of the powder to melt and coalesce. This forms a solid layer. After the first layer is formed, a new thin layer of polymer powder can be spread over the powder bed and the process is repeated to form additional layers until a complete 3-dimensional part is printed. Such 3-dimensional printing processes can achieve fast throughput with good accuracy.

In one example, a temperature sensor can include a resistor formed of a matrix of sintered elemental transition metal particles interlocked with a matrix of fused thermoplastic polymer particles, wherein the resistor has a positive temperature coefficient of resistance. The sensor can also include a first electrical contact at a first end of the resistor, a second electrical contact at a second end of the resistor, and a resistance measuring device connected to the first electrical contact and the second electrical contact to measure a resistance of the resistor. In certain specific examples, the elemental transition metal particles can include silver particles, copper particles, gold particles, or combinations thereof. In other examples, the matrix of fused thermoplastic polymer particles can include a fusing agent selected from carbon black, a near-infrared absorbing dye, a near-infrared absorbing pigment, a tungsten bronze, a molybdenum bronze, metal nanoparticles, a conjugated polymer, or combinations thereof. The resistor can include a halogen salt in the matrix of sintered elemental transition metal particles, the matrix of fused thermoplastic polymer particles, or both. Resistors used in the temperature sensors described herein can, in some examples, have a resistance from 1 ohm to 1 Mega ohm.

In another example of the present technology, a 3-dimensional printed part having an integrated temperature sensor can include a part body formed of fused thermoplastic polymer particles, and a resistor formed of a matrix of sintered elemental transition metal particles interlocked with a matrix of fused thermoplastic polymer particles. The matrix of fused thermoplastic polymer particles can be continuously fused to the fused thermoplastic polymer particles of the part body, and the resistor has a positive temperature coefficient of resistance. The 3-dimensional printed part can also include a first electrical contact at a first end of the resistor, a second electrical contact at a second end of the resistor, and a resistance measuring device connected to the first electrical contact and the second electrical contact to measure a resistance of the resistor. In certain examples of the 3-dimensional printed parts can have integrated temperature sensors, and the elemental transition metal particles can include silver particles, copper particles, gold particles, or combinations thereof. In further examples, the fused thermoplastic polymer particles can include a fusing agent selected from carbon black, a near-infrared absorbing dye, a near-infrared absorbing pigment, a tungsten bronze, a molybdenum bronze, metal nanoparticles, a conjugated polymer, or combinations thereof. In still further examples, the resistor can also include a halogen salt in the matrix of sintered elemental transition metal particles, the matrix of fused thermoplastic polymer particles, or both. A resistor can also be formed as a part of the 3-dimensional printed part according to certain examples of the present technology, and can have a resistance from 1 ohm to 1 Mega ohm. In some specific examples, the resistor can be embedded in the part body of the 3-dimensional printed part. In further examples, the 3-dimensional printed part can be formed of multiple layers of fused thermoplastic polymer particles stacked in a z-axis direction, and the resistor can be oriented at least partially in the z-axis direction.

Another example of the present technology can include a method of making a 3-dimensional printed part having an integrated temperature sensor. The method can include steps of dispensing a conductive fusing agent composition including a transition metal onto a first area of a layer of thermoplastic polymer particles, and dispensing a second fusing agent composition onto a second area of the layer of thermoplastic polymer particles. The second fusing agent composition can include a fusing agent capable of absorbing electromagnetic radiation to produce heat. An additional step can include fusing the first and second areas with electromagnetic radiation to form a resistor in the first area and a part body in the second area, wherein the resistor includes a matrix of sintered transition metal particles interlocked with a matrix of fused thermoplastic polymer particles, and the part body includes fused thermoplastic polymer particles, and wherein the resistor has a positive temperature coefficient of resistance. Another step can include connecting a resistance measuring device to the resistor to measure a resistance of the resistor. In a specific example of the method, the resistor can be embedded in the part body. In another example of the method, the transition metal can be in the form of elemental transition metal particles.

With this description in mind, FIG. 1 shows an example of a temperature sensor 100. The temperature sensor, which can be a 3-dimensional printed temperature sensor, can include a resistor 110, a first electrical contact 120 at a first end of the resistor, and a second electrical contact 130 at a second end of the resistor. The resistor can be formed of a matrix of sintered elemental transition metal particles interlocked with a matrix of fused thermoplastic polymer particles. This composite material including the matrix of sintered elemental transition metal particles and the matrix of fused thermoplastic polymer particles will be described in more detail below.

Figure 2:
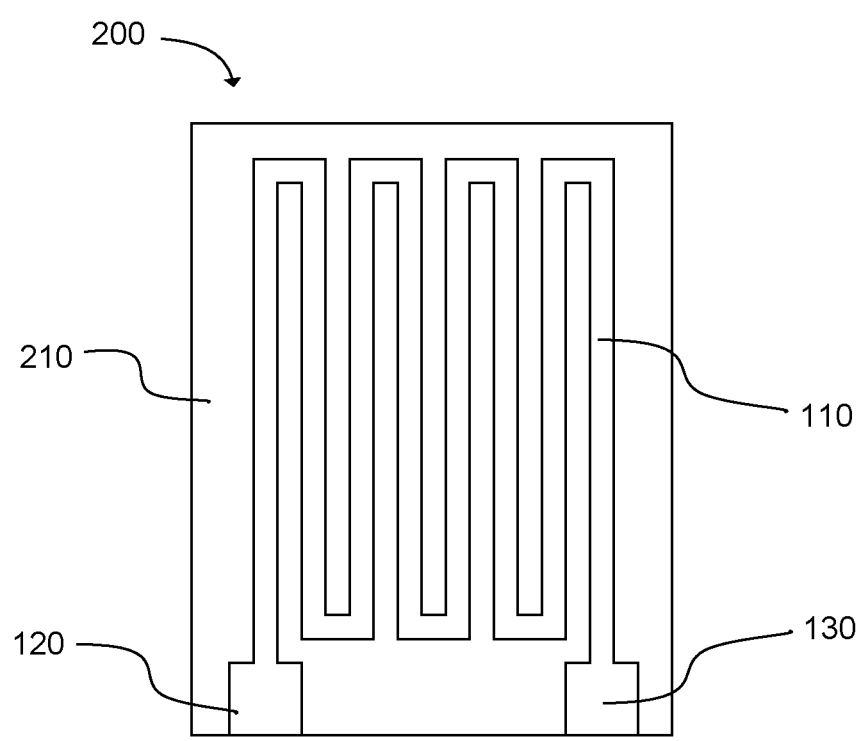
FIG. 2 is a top plan view of a 3-dimensional printed part having an integrated temperature sensor in accordance with examples of the present disclosure.

The present technology also extends to 3-dimensional printed parts having an integrated temperature sensor. FIG. 2 shows an example of such a 3-dimensional printed part 200. The part can include a part body 210 formed of fused thermoplastic polymer particles. The integrated temperature sensor can include a resistor 110, a first electrical contact 120 at a first end of the resistor, and a second electrical contact 130 at a second end of the resistor. As described above, the resistor can be formed of a matrix of sintered elemental transition metal particles interlocked with a matrix of fused thermoplastic polymer particles. The matrix of fused thermoplastic polymer particles can be continuously fused to the fused thermoplastic polymer particles of the part body.

Figure 3:
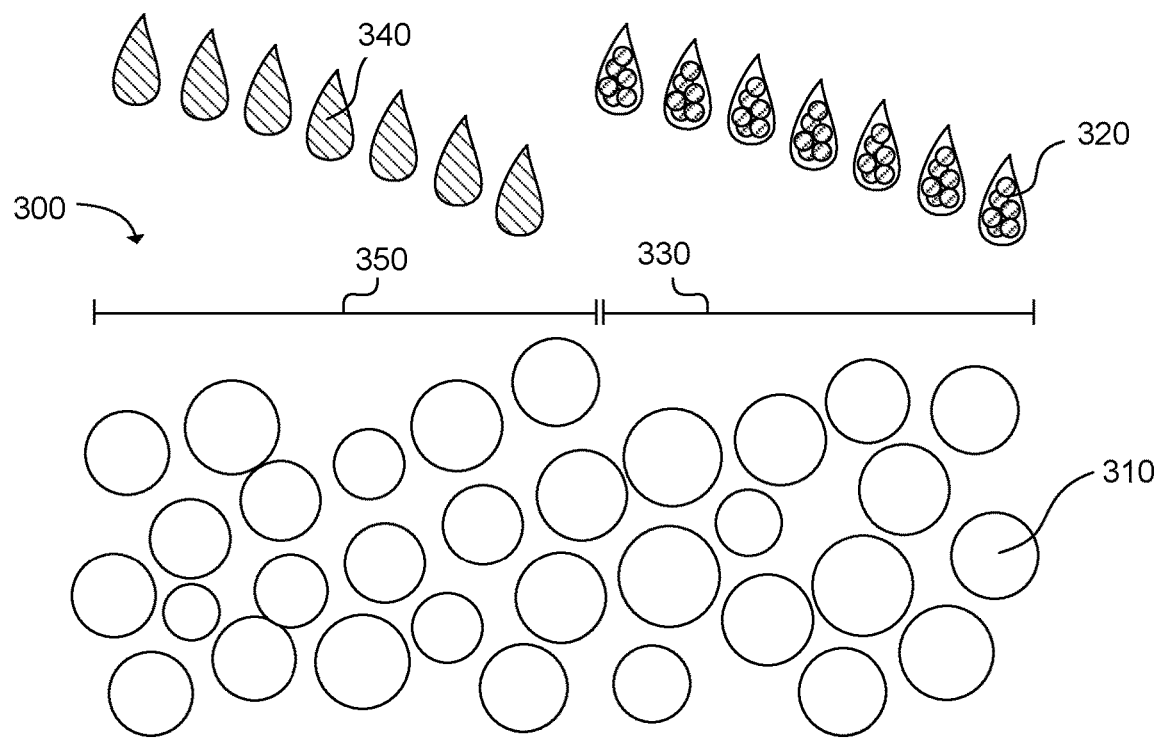
FIG. 3 is a close-up side cross-sectional view of a layer of thermoplastic polymer powder with a conductive fusing agent composition and a second fusing agent composition in accordance with examples of the present disclosure.
Figure 4:
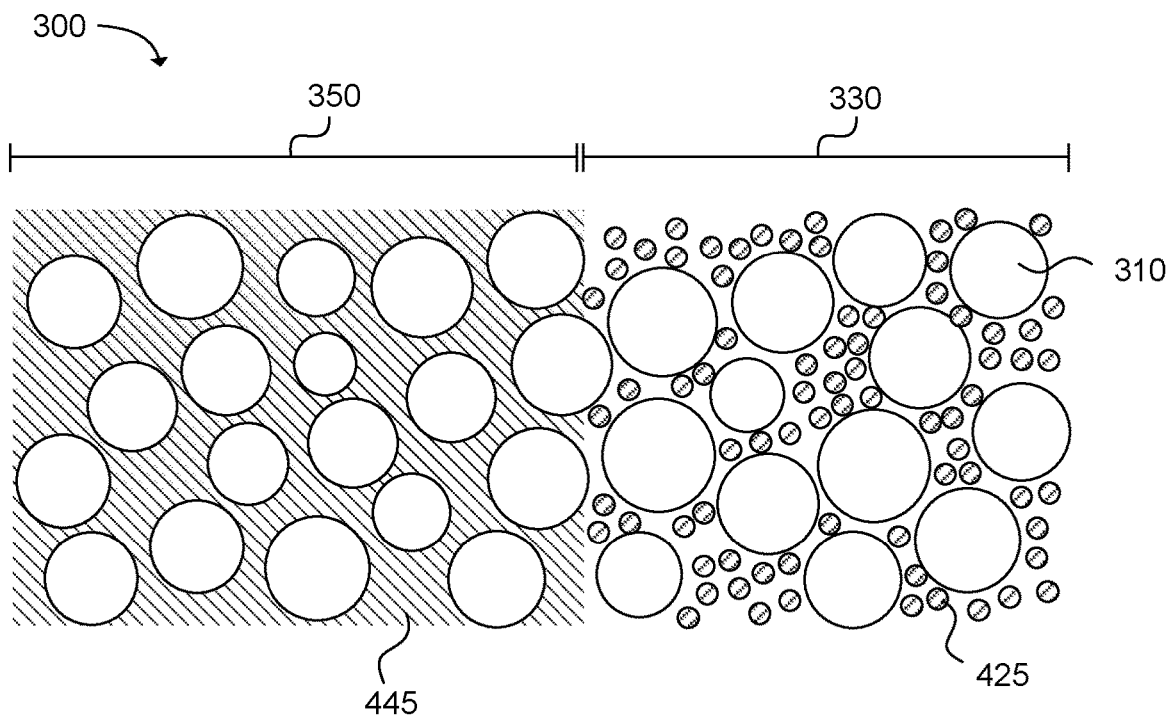
FIG. 4 is a close-up side cross-sectional view of the layer of FIG. 3 after the conductive fusing agent composition and second fusing agent composition have been deposited onto the layer.
Figure 5:
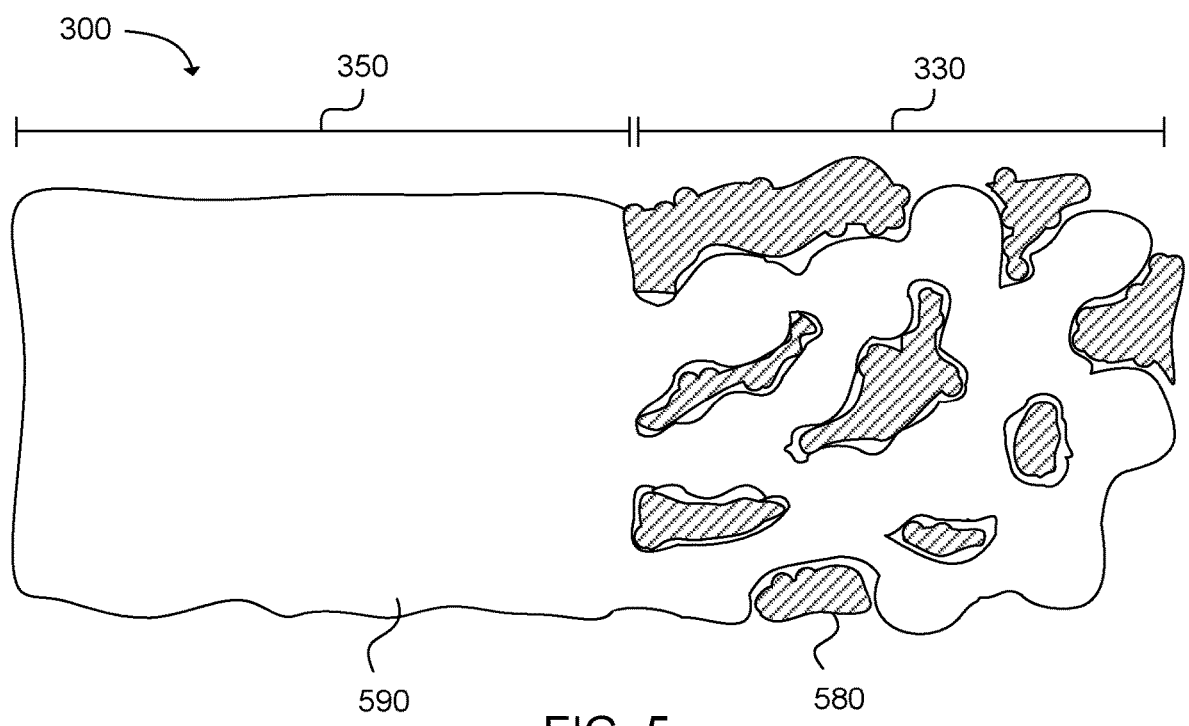
FIG. 5 is a close-up side cross-sectional view of the layer of FIG. 4 after the layer has been fused.

The conductive composite material making up the resistor is shown in more detail in FIGS. 3-5. To form the resistor, as shown in FIG. 3, a layer 300 of thermoplastic polymer powder particles 310 can be treated with a conductive fusing agent composition 320 in a first portion 330 of the layer, and a second fusing agent composition 340 can be dispensed onto a second portion 350 of the layer. The conductive fusing agent composition can include a transition metal. The second fusing agent composition can include a fusing agent capable of absorbing electromagnetic radiation to produce heat.

FIG. 4 shows the layer 300 of thermoplastic polymer particles 310 after the conductive fusing agent composition and second fusing agent composition have been applied. At this point the layer includes transition metal particles 425 and a fusing agent 445 in spaces between thermoplastic polymer particles in the first portion 330 and second portion 350, respectively.

It should be noted that these figures are not necessarily drawn to scale, and the relative sizes of thermoplastic polymer particles and transition metal particles can differ from those shown. For example, in many cases the transition metal particles can be much smaller than the thermoplastic polymer particles, such as 2-3 orders of magnitude smaller.

FIG. 5 shows the layer 300 after being cured. When the layer is cured by exposure to electromagnetic radiation, the transition metal particles in the first portion 330 sinter together to form a matrix of sintered metal particles 580. The thermoplastic polymer particles fuse together in both the first portion and the second portion 350, forming a matrix of fused thermoplastic polymer particles 590. The matrix of sintered metal particles and the fused thermoplastic polymer particles in the first portion are interlocked, forming the conductive composite. It should be noted that FIGS. 3-5 shows only a 2-dimensional cross-section of the conductive composite. Although the sintered metal particles appear to be in isolated locations in the figure, the matrix of sintered metal particles can be a continuously connected matrix in three dimensions. Thus, the conductive composite can have good electrical conductivity through the matrix of sintered transition metal particles A variety of materials can be used to form the 3-dimensional printed temperature sensors and parts having integrated temperature sensors. In some examples, the materials can include a thermoplastic polymer powder, a conductive fusing agent composition, and a second fusing agent composition. The thermoplastic polymer powder can include powder particles with an average particle size from 20 µm to 100 µm. As used herein, "average" with respect to properties of particles refers to a number average unless otherwise specified. Accordingly, "average particle size" refers to a number average particle size. Additionally, "particle size" refers to the diameter of spherical particles, or to the longest dimension of non-spherical particles.

In certain examples, the polymer particles can have a variety of shapes, such as substantially spherical particles or irregularly-shaped particles. In some examples, the polymer powder can be capable of being formed into 3D printed parts with a resolution of 20 to 100 microns. As used herein, "resolution" refers to the size of the smallest feature that can be formed on a 3D printed part. The polymer powder can form layers from about 20 to about 100 microns thick, allowing the fused layers of the printed part to have roughly the same thickness. This can provide a resolution in the z-axis direction of about 20 to about 100 microns. The polymer powder can also have a sufficiently small particle size and sufficiently regular particle shape to provide about 20 to about 100 micron resolution along the x-axis and y-axis.

In some examples, the thermoplastic polymer powder can be colorless. For example, the polymer powder can have a white, translucent, or transparent appearance. When used with a colorless fusing agent composition, such polymer powders can provide a printed part that is white, translucent, or transparent. In other examples, the polymer powder can be colored for producing colored parts. In still other examples, when the polymer powder is white, translucent, or transparent, color can be imparted to the part by the fusing agent composition or a colored ink.

The thermoplastic polymer powder can have a melting or softening point from about 70° C. to about 350° C. In further examples, the polymer can have a melting or softening point from about 150° C. to about 200° C. A variety of thermoplastic polymers with melting points or softening points in these ranges can be used. For example, the polymer powder can be selected from the group consisting of nylon 6 powder, nylon 9 powder, nylon 11 powder, nylon 12 powder, nylon 66 powder, nylon 612 powder, polyethylene powder, thermoplastic polyurethane powder, polypropylene powder, polyester powder, polycarbonate powder, polyether ketone powder, polyacrylate powder, polystyrene powder, and mixtures thereof. In a specific example, the polymer powder can be nylon 12, which can have a melting point from about 175° C. to about 200° C. In another specific example, the polymer powder can be thermoplastic polyurethane.

The thermoplastic polymer particles can also in some cases be blended with a filler. The filler can include inorganic particles such as alumina, silica, or combinations thereof. When the thermoplastic polymer particles fuse together, the filler particles can become embedded in the polymer, forming a composite material. In some examples, the filler can include a free-flow agent, anti-caking agent, or the like. Such agents can prevent packing of the powder particles, coat the powder particles and smooth edges to reduce inter-particle friction, and/or absorb moisture. In some examples, a weight ratio of thermoplastic polymer particles to filler particles can be from 10:1 to 1:2 or from 5:1 to 1:1.

A conductive fusing agent composition can be used to form portions of a 3-dimensional printed part that will act as a resistor in the temperature sensor. The conductive fusing agent composition can include a transition metal. When the conductive fusing agent composition is printed onto a layer of the thermoplastic polymer powder, the conductive fusing agent composition can penetrate into the spaces between powder particles. The layer can then be cured by exposing the layer to electromagnetic radiation. The conductive fusing agent composition can facilitate fusing of the powder particles by absorbing energy from the electromagnetic radiation and converting the energy to heat. This raises the temperature of the powder above the melting or softening point of the thermoplastic polymer. Additionally, during printing, curing, or both, the transition metal in the conductive fusing agent composition can form a conductive transition metal matrix that becomes interlocked with the fused thermoplastic polymer particles.

In some examples, the transition metal in the conductive fusing agent composition can be in the form of elemental transition metal particles. The elemental transition metal particles can include, for example, silver particles, copper particles, gold particles, platinum particles, palladium particles, chromium particles, nickel particles, zinc particles, or combinations thereof. The particles can also include alloys of more than one transition metal, such as Au—Ag, Ag—Cu, Ag—Ni, Au—Cu, Au—Ni, Au—Ag—Cu, or Au—Ag—Pd.

In certain examples, other non-transition metals can be included in addition to the transition metal. The non-transition metals can include lead, tin, bismuth, indium, gallium, and others. In some examples, soldering alloys can be included. The soldering alloys can include alloys of lead, tin, bismuth, indium, zinc, gallium, silver, copper, in various combinations. In certain examples, such soldering alloys can be printed in locations that are to be used as soldering connections for printed electrical components. The soldering alloys can be formulated to have low melting temperatures useful for soldering, such as less than 230° C.

In further examples, the elemental transition metal particles can be nanoparticles having an average particle size from 10 nm to 200 nm. In more specific examples, the elemental transition metal particles can have an average particle size from 30 nm to 70 nm.

As metal particles are reduced in size, the temperature at which the particles are capable of being sintered can also be reduced. Therefore, using elemental transition metal nanoparticles in the conductive fusing agent composition can allow the particles to sinter and form a conductive matrix of sintered nanoparticles at relatively low temperatures. For example, the elemental transition metal particles in the conductive fusing agent composition can be capable of being sintered at or below the temperature reached during curing in the 3-dimensional printing process. In a further example, the thermoplastic polymer powder bed can be heated to a preheat temperature during the printing process, and the elemental transition metal particles can be capable of being sintered at or below the preheat temperature. In still further examples, the elemental transition metal particles can be capable of being sintered at a temperature from 20° C. to 350° C. As used herein, the temperature at which the elemental transition metal particles are capable of being sintered refers to the lowest temperature at which the particles will become sintered together, forming a conductive matrix of sintered particles. It is understood that temperatures above this lowest temperature will also cause the particles to become sintered.

In additional examples of the conductive fusing agent composition, the transition metal can be in the form of elemental transition metal particles that are stabilized by a dispersing agent at surfaces of the particles. The dispersing agent can include ligands that passivate the surface of the particles. Suitable ligands can include a moiety that binds to the transition metal. Examples of such moieties can include sulfonic acid, phosphonic acid, carboxylic acid, dithiocarboxylic acid, phosphonate, sulfonate, thiol, carboxylate, dithiocarboxylate, amine, and others. In some cases, the dispersing agent can contain an alkyl group having from 3-20 carbon atoms, with one of the above moieties at an end of the alkyl chain. In certain examples, the dispersing agent can be an alkylamine, alkylthiol, or combinations thereof. In further examples, the dispersing agent can be a polymeric dispersing agent, such as polyvinylpyrrolidone (PVP), polyvinylalcohol (PVA), polymethylvinylether, poly(acrylic acid) (PAA), nonionic surfactants, polymeric chelating agents, and others. The dispersing agent can bind to the surfaces of the elemental transition metal particles through chemical and/or physical attachment. Chemical bonding can include a covalent bond, hydrogen bond, coordination complex bond, ionic bond, or combinations thereof. Physical attachment can include attachment through van der Waal's forces, dipole-dipole interactions, or a combination thereof.

In further examples, the conductive fusing agent composition can include a transition metal in the form of a metal salt or metal oxide. Under certain conditions, a transition metal salt or metal oxide in the conductive fusing agent composition can form elemental transition metal particles in situ after being printed onto the thermoplastic polymer powder bed. The elemental transition metal particles thus formed can then be sintered together to form a conductive matrix. In some examples, a reducing agent can be reacted with the metal salt or metal oxide to produce elemental metal particles. In one example, a reducing agent can be underprinted onto the powder bed before the conductive fusing agent composition. In another example, a reducing agent can be overprinted over the conductive fusing agent composition. In either case, the reducing agent can be reacted with the metal salt or metal oxide to form elemental metal particles before the thermoplastic polymer particle layer is cured. Suitable reducing agents can include, for example, glucose, fructose, maltose, maltodextrin, trisodium citrate, ascorbic acid, sodium borohydride, ethylene glycol, 1,5-pentanediol, 1,2-propylene glycol, and others.

The concentration of transition metal in the conductive fusing agent composition can vary. However, higher transition metal concentrations can tend to provide better conductivity due to a larger amount of conductive material being deposited on the powder bed. In some examples, the conductive fusing agent composition can contain from about 5 wt % to about 50 wt % of the transition metal, with respect to the entire weight of the conductive fusing agent composition. In further examples, the conductive fusing agent composition can contain from about 10 wt % to about 30 wt % of the transition metal, with respect to the entire weight of the conductive fusing agent composition.

In some examples of the present technology, a pretreat composition can be used with the conductive fusing agent composition. The pretreat composition can include a halogen salt, such as sodium chloride or potassium chloride, for example. The halogen salt can react with dispersing agents at the surfaces of transition metal particles to remove the dispersing agents from the particles. This can increase the sintering between the metal particles and improve the conductivity of the matrix formed of the sintered particles. The pretreat composition can be dispensed onto the powder bed before the conductive fusing agent composition. When the conductive fusing agent composition is printed over the pretreat composition, the transition metal particles can come into contact with the halogen salt in the pretreat composition. In alternate examples, the polymer powder can be pretreated with a halogen salt before being used in the 3-dimensional printing system. When the conductive fusing agent composition is printed onto the powder bed, the transition metal particles in the conductive fusing agent composition can come into contact with the halogen salt already present on the powder.

A second fusing agent composition can also be incorporated in the materials used to make 3-dimensional printed temperature sensors and parts having integrated temperature sensors. In some examples, the second fusing agent composition can be devoid or substantially devoid of the transition metal contained in the conductive fusing agent composition. Thus, the second fusing agent composition can provide a lower conductivity than the conductive fusing agent composition when printed on the thermoplastic polymer powder. However, in some examples the second fusing agent composition can include metal particles that provide a lower conductivity than the transition metal in the conductive fusing agent composition. For example, the second fusing agent composition can include metal particles with passivated surfaces that do not sinter together to form a conductive matrix.

The second fusing agent composition can contain another fusing agent that is capable of absorbing electromagnetic radiation to produce heat. The fusing agent can be colored or colorless. In various examples, the fusing agent can be carbon black, near-infrared absorbing dyes, near-infrared absorbing pigments, tungsten bronzes, molybdenum bronzes, metal nanoparticles, or combinations thereof. Examples of near-infrared absorbing dyes include aminium dyes, tetraaryldiamine dyes, cyanine dyes, pthalocyanine dyes, dithiolene dyes, and others. In further examples, the fusing agent can be a near-infrared absorbing conjugated polymer such as poly(3,4-ethylenedioxythiophene)-poly(styrenesulfonate) (PEDOT:PSS), a polythiophene, poly(p-phenylene sulfide), a polyaniline, a poly(pyrrole), a poly(acetylene), poly(p-phenylene vinylene), polyparaphenylene, or combinations thereof. As used herein, "conjugated" refers to alternating double and single bonds between atoms in a molecule. Thus, "conjugated polymer" refers to a polymer that has a backbone with alternating double and single bonds. In many cases, the fusing agent can have a peak absorption wavelength in the range of 800 nm to 1400 nm.

The amount of fusing agent in the second fusing agent composition can vary depending on the type of fusing agent. In some examples, the concentration of fusing agent in the second fusing agent composition can be from 0.1 wt % to 20 wt %. In one example, the concentration of fusing agent in the second fusing agent composition can be from 0.1 wt % to 15 wt %. In another example, the concentration can be from 0.1 wt % to 8 wt %. In yet another example, the concentration can be from 0.5 wt % to 2 wt %. In a particular example, the concentration can be from 0.5 wt % to 1.2 wt %.

The fusing agent can have a temperature boosting capacity sufficient to increase the temperature of the polymer powder above the melting or softening point of the polymer powder. As used herein, "temperature boosting capacity" refers to the ability of a fusing agent to convert near-infrared light energy into thermal energy to increase the temperature of the printed polymer powder over and above the temperature of the unprinted portion of the polymer powder. Typically, the polymer powder particles can be fused together when the temperature increases to the melting or softening temperature of the polymer. As used herein, "melting point" refers to the temperature at which a polymer transitions from a crystalline phase to a pliable, amorphous phase. Some polymers do not have a melting point, but rather have a range of temperatures over which the polymers soften. This range can be segregated into a lower softening range, a middle softening range and an upper softening range. In the lower and middle softening ranges, the particles can coalesce to form a part while the remaining polymer powder remains loose. If the upper softening range is used, the whole powder bed can become a cake. The "softening point," as used herein, refers to the temperature at which the polymer particles coalesce while the remaining powder remains separate and loose. When the fusing agent composition is printed on a portion of the polymer powder, the fusing agent can heat the printed portion to a temperature at or above the melting or softening point, while the unprinted portions of the polymer powder remain below the melting or softening point. This allows the formation of a solid 3D printed part, while the loose powder can be easily separated from the finished printed part.

Although melting point and softening point are often described herein as the temperatures for coalescing the polymer powder, in some cases the polymer particles can coalesce together at temperatures slightly below the melting point or softening point. Therefore, as used herein "melting point" and "softening point" can include temperatures slightly lower, such as up to about 20° C. lower, than the actual melting point or softening point.

In one example, the fusing agent can have a temperature boosting capacity from about 10° C. to about 70° C. for a polymer with a melting or softening point from about 100° C. to about 350° C. If the powder bed is at a temperature within about 10° C. to about 70° C. of the melting or softening point, then such a fusing agent can boost the temperature of the printed powder up to the melting or softening point, while the unprinted powder remains at a lower temperature. In some examples, the powder bed can be preheated to a temperature from about 10° C. to about 70° C. lower than the melting or softening point of the polymer. The fusing agent composition can then be printed onto the powder and the powder bed can be irradiated with a near-infrared light to coalesce the printed portion of the powder.

In some examples of the present technology, the conductive fusing agent composition and the second fusing agent composition can be balanced so that thermoplastic polymer powder that is printed with the conductive fusing agent composition and the second fusing agent composition reach nearly the same temperature when exposed to light during curing. The type and amount of fusing agent in the second fusing agent composition can be selected to match the temperature boosting capacity of the transition metal in the conductive fusing agent composition. The type and amount of transition metal in the conductive fusing agent composition can also be adjusted to match the temperature boosting capacity of the fusing agent in the second fusing agent composition. Additionally, in some examples the conductive fusing agent composition can contain another fusing agent other than the transition metal. In certain examples, the conductive fusing agent composition and the second fusing agent composition can raise the temperature of the thermoplastic polymer powder to temperatures within 30° C., within 20° C., or within 10° C. of each other during curing.

In further examples, colored inks can also be used for adding color to the thermoplastic polymer powder. This can allow for printing of full-color 3-dimensional parts. In one example, the cyan, magenta, yellow, and black inks can be used in addition to the conductive fusing agent composition, second fusing agent composition, and pretreat composition if present.

Each of the conductive fusing agent composition, pretreat composition, second fusing agent composition, and additional colored inks can be formulated for use in a fluid jet printer such as an ink jet printer. The transition metal and fusing agents can be stable in a liquid jetting vehicle and the inks can provide good jetting performance. In some examples, the transition metal and fusing agents can be water-soluble, water-dispersible, organic-soluble, or organic-dispersible. The transition metal and fusing agents can also be compatible with the thermoplastic polymer powder so that jetting the compositions onto the polymer powder provides adequate coverage and penetration of the transition metal and fusing agents into the powder.

Any of the above described compositions can also include a pigment or dye colorant that imparts a visible color to the compositions. In some examples, the colorant can be present in an amount from 0.5 wt % to 10 wt % in the compositions. In one example, the colorant can be present in an amount from 1 wt % to 5 wt %. In another example, the colorant can be present in an amount from 5 wt % to 10 wt %. However, the colorant is optional and in some examples the compositions can include no additional colorant. These compositions can be used to print 3D parts that retain the natural color of the polymer powder. Additionally, the compositions can include a white pigment such as titanium dioxide that can also impart a white color to the final printed part. Other inorganic pigments such as alumina or zinc oxide can also be used.

In some examples, the colorant can be a dye. The dye may be nonionic, cationic, anionic, or a mixture of nonionic, cationic, and/or anionic dyes. Specific examples of dyes that may be used include, but are not limited to, Sulforhodamine B, Acid Blue 113, Acid Blue 29, Acid Red 4, Rose Bengal, Acid Yellow 17, Acid Yellow 29, Acid Yellow 42, Acridine Yellow G, Acid Yellow 23, Acid Blue 9, Nitro Blue Tetrazolium Chloride Monohydrate or Nitro BT, Rhodamine 6G, Rhodamine 123, Rhodamine B, Rhodamine B Isocyanate, Safranine O, Azure B, and Azure B Eosinate, which are available from Sigma-Aldrich Chemical Company (St. Louis, Mo.). Examples of anionic, water-soluble dyes include, but are not limited to, Direct Yellow 132, Direct Blue 199, Magenta 377 (available from Ilford AG, Switzerland), alone or together with Acid Red 52. Examples of water-insoluble dyes include azo, xanthene, methine, polymethine, and anthraquinone dyes. Specific examples of water-insoluble dyes include Orasol® Blue GN, Orasol® Pink, and Orasol® Yellow dyes available from Ciba-Geigy Corp. Black dyes may include, but are not limited to, Direct Black 154, Direct Black 168, Fast Black 2, Direct Black 171, Direct Black 19, Acid Black 1, Acid Black 191, Mobay Black SP, and Acid Black 2.

In other examples, the colorant can be a pigment. The pigment can be self-dispersed with a polymer, oligomer, or small molecule; or can be dispersed with a separate dispersant. Suitable pigments include, but are not limited to, the following pigments available from BASF: Paliogen®) Orange, Heliogen® Blue L 6901F, Heliogen®) Blue NBD 7010, Heliogen® Blue K 7090, Heliogen® Blue L 7101F, Paliogen®) Blue L 6470, Heliogen®) Green K 8683, and Heliogen® Green L 9140. The following black pigments are available from Cabot: Monarch® 1400, Monarch® 1300, Monarch®) 1100, Monarch® 1000, Monarch®) 900, Monarch® 880, Monarch® 800, and Monarch®) 700. The following pigments are available from CIBA: Chromophtal®) Yellow 3G, Chromophtal®) Yellow GR, Chromophtal®) Yellow 8G, Igrazin® Yellow SGT, Igralite Rubine 4BL, Monastral® Magenta, Monastral® Scarlet, Monastral® Violet R, Monastral® Red B, and Monastral® Violet Maroon B. The following pigments are available from Degussa: Printex® U, Printex® V, Printex® 140U, Printex® 140V, Color Black FW 200, Color Black FW 2, Color Black FW 2V, Color Black FW 1, Color Black FW 18, Color Black S 160, Color Black S 170, Special Black 6, Special Black 5, Special Black 4A, and Special Black 4. The following pigment is available from DuPont: Tipure®) R-101. The following pigments are available from Heubach: Dalamar® Yellow YT-858-D and Heucophthal Blue G XBT-583D. The following pigments are available from Clariant: Permanent Yellow GR, Permanent Yellow G, Permanent Yellow DHG, Permanent Yellow NCG-71, Permanent Yellow GG, Hansa Yellow RA, Hansa Brilliant Yellow 5GX-02, Hansa Yellow-X, Novoperm® Yellow HR, Novoperm® Yellow FGL, Hansa Brilliant Yellow 10GX, Permanent Yellow G3R-01, Hostaperm® Yellow H4G, Hostaperm® Yellow H3G, Hostaperm® Orange GR, Hostaperm® Scarlet GO, and Permanent Rubine F6B. The following pigments are available from Mobay: Quindo® Magenta, Indofast® Brilliant Scarlet, Quindo® Red R6700, Quindo® Red R6713, and Indofast® Violet. The following pigments are available from Sun Chemical: L74-1357 Yellow, L75-1331 Yellow, and L75-2577 Yellow. The following pigments are available from Columbian: Raven® 7000, Raven® 5750, Raven® 5250, Raven® 5000, and Raven® 3500. The following pigment is available from Sun Chemical: LHD9303 Black. Any other pigment and/or dye can be used that is useful in modifying the color of the above described compositions and/or ultimately, the printed part.

The colorant can be included in the conductive fusing agent composition and/or the second fusing agent composition to impart color to the printed object when the fusing agent compositions are jetted onto the powder bed. Optionally, a set of differently colored fusing agent compositions can be used to print multiple colors. For example, a set of fusing agent compositions including any combination of cyan, magenta, yellow (and/or any other colors), colorless, white, and/or black fusing agent compositions can be used to print objects in full color. Alternatively or additionally, a colorless fusing agent composition can be used in conjunction with a set of colored, non-fusing agent compositions to impart color. In some examples, a colorless fusing agent composition can be used to coalesce the polymer powder and a separate set of colored or black or white inks not containing a fusing agent can be used to impart color.

The components of the above described compositions can be selected to give the compositions good jetting performance and the ability to color the polymer powder with good optical density. Besides the transition metals, fusing agents, colorants and other ingredients described above, the compositions can also include a liquid jetting vehicle. In some examples, the liquid jetting vehicle formulation can include water and one or more co-solvents present in total at from 1 wt % to 50 wt %, depending on the jetting architecture. Further, one or more non-ionic, cationic, and/or anionic surfactant can optionally be present, ranging from 0.01 wt % to 20 wt %. In one example, the surfactant can be present in an amount from 5 wt % to 20 wt %. The liquid jetting vehicle can also include dispersants in an amount from 5 wt % to 20 wt %. The balance of the formulation can be purified water, or other vehicle components such as biocides, viscosity modifiers, materials for pH adjustment, sequestering agents, preservatives, and the like. In one example, the liquid jetting vehicle can be predominantly water. In some examples, a water-dispersible or water-soluble fusing agent can be used with an aqueous vehicle. Because the fusing agent is dispersible or soluble in water, an organic co-solvent is not necessary to solubilize the fusing agent. Therefore, in some examples the compositions can be substantially free of organic solvent. However, in other examples a co-solvent can be used to help disperse other dyes or pigments, or improve the jetting properties of the compositions. In still further examples, a non-aqueous vehicle can be used with an organic-soluble or organic-dispersible fusing agent.

In certain examples, a high boiling point co-solvent can be included in the compositions. The high boiling point co-solvent can be an organic co-solvent that boils at a temperature higher than the temperature of the powder bed during printing. In some examples, the high boiling point co-solvent can have a boiling point above 250° C. In still further examples, the high boiling point co-solvent can be present in the compositions at a concentration from about 1 wt % to about 4 wt %.

Classes of co-solvents that can be used can include organic co-solvents including aliphatic alcohols, aromatic alcohols, diols, glycol ethers, polyglycol ethers, caprolactams, formamides, acetamides, and long chain alcohols. Examples of such compounds include primary aliphatic alcohols, secondary aliphatic alcohols, 1,2-alcohols, 1,3-alcohols, 1,5-alcohols, ethylene glycol alkyl ethers, propylene glycol alkyl ethers, higher homologs ($C_6$-$C_{12}$) of polyethylene glycol alkyl ethers, N-alkyl caprolactams, unsubstituted caprolactams, both substituted and unsubstituted formamides, both substituted and unsubstituted acetamides, and the like. Specific examples of solvents that can be used include, but are not limited to, 2-pyrrolidinone, N-methylpyrrolidone, 2-hydroxyethyl-2-pyrrolidone, 2-methyl-1,3-propanediol, tetraethylene glycol, 1,6-hexanediol, 1,5-hexanediol and 1,5-pentanediol.

One or more surfactants can also be used, such as alkyl polyethylene oxides, alkyl phenyl polyethylene oxides, polyethylene oxide block copolymers, acetylenic polyethylene oxides, polyethylene oxide (di)esters, polyethylene oxide amines, protonated polyethylene oxide amines, protonated polyethylene oxide amides, dimethicone copolyols, substituted amine oxides, and the like. The amount of surfactant added to the formulation of this disclosure may range from 0.01 wt % to 20 wt %. Suitable surfactants can include, but are not limited to, liponic esters such as Tergitol™ 15-S-12, Tergitol™ 15-S-7 available from Dow Chemical Company, LEG-1 and LEG-7; Triton™ X-100; Triton™ X-405 available from Dow Chemical Company and sodium dodecylsulfate.

Consistent with the formulation of this disclosure, various other additives can be employed to optimize the properties of the compositions for specific applications. Examples of these additives are those added to inhibit the growth of harmful microorganisms. These additives may be biocides, fungicides, and other microbial agents. Examples of suitable microbial agents include, but are not limited to, NUOSEPT® (Nudex, Inc.), UCARCIDE™ (Union carbide Corp.), VANCIDE® (R.T. Vanderbilt Co.), PROXEL® (ICI America), and combinations thereof.

Sequestering agents, such as EDTA (ethylene diamine tetra acetic acid), may be included to eliminate the deleterious effects of heavy metal impurities, and buffer solutions may be used to control the pH of the compositions. From 0.01 wt % to 2 wt %, for example, can be used. Viscosity modifiers and buffers may also be present, as well as other additives to modify properties of the compositions as desired. Such additives can be present at from 0.01 wt % to 20 wt %.

Figure 6:
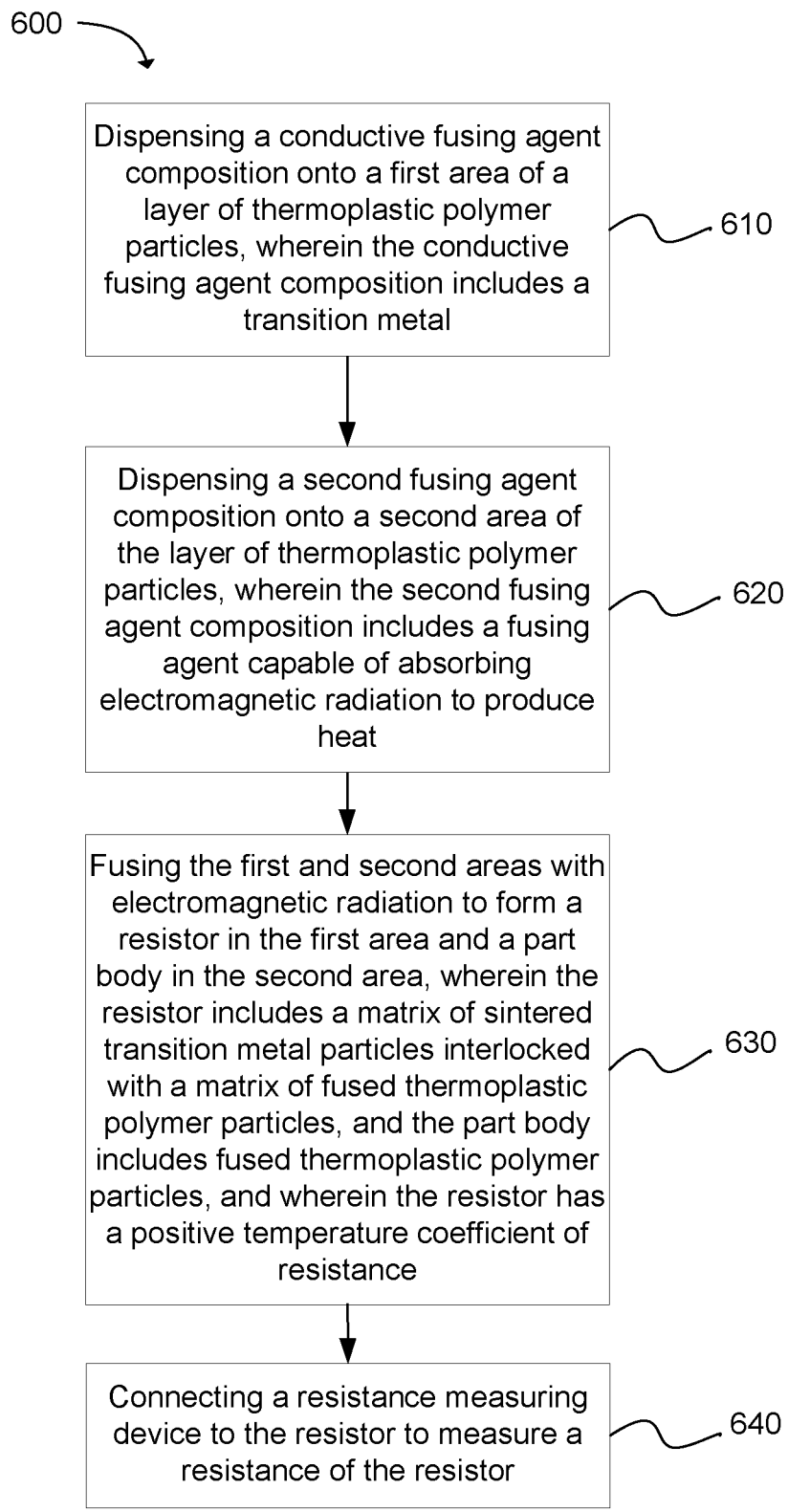
FIG. 6 is a flow chart illustrating a method of making a 3-dimensional printed part having an integrated temperature sensor in accordance with examples of the present disclosure.

The present technology also extends to methods of making 3-dimensional printed parts having integrated temperature sensors. The methods can use any of the materials described above. FIG. 6 is a flowchart of an exemplary method 600 of making a 3-dimensional printed part having an integrated temperature sensor. The method includes dispensing a conductive fusing agent composition onto a first area of a layer of thermoplastic polymer particles, wherein the conductive fusing agent composition includes a transition metal 610; dispensing a second fusing agent composition onto a second area of the layer of thermoplastic polymer particles, wherein the second fusing agent composition includes a fusing agent capable of absorbing electromagnetic radiation to produce heat 620; fusing the first and second areas with electromagnetic radiation to form a resistor in the first area and a part body in the second area, wherein the resistor includes a matrix of sintered transition metal particles interlocked with a matrix of fused thermoplastic polymer particles, and the part body includes fused thermoplastic polymer particles, and wherein the resistor has a positive temperature coefficient of resistance 630; and connecting a resistance measuring device to the resistor to measure a resistance of the resistor 640.

In further examples, methods of making 3-dimensional printed parts having integrated temperature sensors can include dispensing additional compositions onto the thermoplastic polymer particles. For example, a pretreat composition can be dispensed onto the polymer particles before dispensing the conductive fusing agent composition. The pretreat composition can include a halogen salt such as sodium chloride or potassium chloride to remove dispersing agents from the transition metal particles in the conductive fusing agent composition. Colored inks can also be dispensed onto the polymer particles to provide visible colors to the printed part.

In some examples, the fusing agent compositions and other compositions can be dispensed by fluid jetting. This can be performed by a fluid jet printing system such as a thermal ink jet printing system or a piezo ink jet printing system. Any other suitable method of dispensing the compositions onto the polymer particles can also be used.

In additional examples, the methods described herein can be performed using a powder bed 3-dimensional printing system. In one example, the bed of the thermoplastic polymer particles can be formed by introducing polymer powder from a polymer powder supply and rolling the powder in a thin layer using a roller. The conductive fusing agent composition and second fusing agent composition can be jetted using fluid jet print heads. The amount of conductive fusing agent composition printed can be calibrated based on the concentration of transition metal in the composition, the temperature boosting capacity of the transition metal, the desired conductivity of the resulting conductive composite material to be printed, among other factors. Similarly, the amount of the second fusing agent composition printed can be calibrated based the concentration of fusing agent, temperature boosting capacity of the fusing agent, and other factors. In some examples, the amount of fusing agent composition printed can be sufficient to saturate the powder layer, thereby contacting a fused layer below and upon curing forming a continuous part. For example, if each layer of polymer powder is 100 microns thick, then the fusing agent composition can penetrate at least 100 microns into the polymer powder. Thus the fusing agents can heat the polymer powder throughout the entire layer so that the layer can coalesce and bond to the layer below. After forming a solid layer, a new layer of loose powder can be formed, either by lowering the powder bed or by raising the height of the roller and rolling a new layer of powder.

The entire powder bed can be preheated to a temperature below the melting or softening point of the polymer powder. In one example, the preheat temperature can be from about 10° C. to about 30° C. below the melting or softening point. In another example, the preheat temperature can be within 50° C. of the melting of softening point. In a particular example, the preheat temperature can be from about 160° C. to about 170° C. and the polymer powder can be nylon 12 powder. In another example, the preheat temperature can be about 90° C. to about 100° C. and the polymer powder can be thermoplastic polyurethane. Preheating can be accomplished with one or more lamps, an oven, a heated support bed, or other types of heaters. In some examples, the entire powder bed can be heated to a substantially uniform temperature.

The powder bed can be irradiated with a fusing lamp. Suitable fusing lamps for use in the methods described herein can include commercially available infrared lamps and halogen lamps. The fusing lamp can be a stationary lamp or a moving lamp. For example, the lamp can be mounted on a track to move horizontally across the powder bed. Such a fusing lamp can make multiple passes over the bed depending on the amount of exposure needed to coalesce each printed layer. The fusing lamp can be configured to irradiate the entire powder bed with a substantially uniform amount of energy. This can selectively coalesce the printed portions with fusing agent compositions leaving the unprinted portions of the polymer powder below the melting or softening point.

In one example, the fusing lamp can be matched with the fusing agents in the fusing agent compositions so that the fusing lamp emits wavelengths of light that match the peak absorption wavelengths of the fusing agents. A fusing agent with a narrow peak at a particular near-infrared wavelength can be used with a fusing lamp that emits a narrow range of wavelengths at approximately the peak wavelength of the fusing agent. Similarly, a fusing agent that absorbs a broad range of near-infrared wavelengths can be used with a fusing lamp that emits a broad range of wavelengths. Matching the fusing agent and the fusing lamp in this way can increase the efficiency of coalescing the polymer particles with the fusing agent printed thereon, while the unprinted polymer particles do not absorb as much light and remain at a lower temperature.

Depending on the amount of fusing agent present in the polymer powder, the absorbance of the fusing agent, the preheat temperature, and the melting or softening point of the polymer, an appropriate amount of irradiation can be supplied from the fusing lamp. In some examples, the fusing lamp can irradiate each layer from about 0.5 to about 10 seconds per pass.

In further examples, methods of making 3-dimensional printed parts having integrated temperature sensors can include tuning the resistance of the 3-dimensional printed resistor to a desired range. As explained above, the resistor can have the form of a conductive composite with a matrix of fused thermoplastic polymer particles interlocked with a matrix of sintered transition metal particles. The resistance of the conductive composite can be tuned in a variety of ways. For example, the resistance can be affected by the type of transition metal in the conductive fusing agent composition, the concentration of the transition metal in the conductive fusing agent composition, the amount of conductive fusing agent composition dispensed onto the powder bed, the cross section and length of the resistor, and so on. When the conductive fusing agent composition is dispensed by fluid jetting, the amount of conductive fusing agent composition dispensed can be adjusted by changing print speed, drop weight, number of slots from which the composition is fired in the fluid jet printer, and number of passes printed per powder layer. In certain examples, a conductive composite element can have a resistance from 1 ohm to 5 Mega ohms.

Sufficient conductivity can be achieved by dispensing a sufficient amount of the transition metal onto the powder bed. In some examples, a sufficient mass of the transition metal per volume of the conductive composite can be used to achieve conductivity. For example, the mass of transition metal per volume of conductive composite can be greater than 1 mg/cm$^3$, greater than 10 mg/cm$^3$, greater than 50 mg/cm$^3$, or greater than 100 mg/cm$^3$. In a particular example, the mass of transition metal per volume of the conductive composite can be greater than 140 mg/cm$^3$. In further examples, the mass of transition metal per volume of conductive composite can be from 1 mg/cm$^3$ to 1000 mg/cm$^3$, from 10 mg/cm$^3$ to 1000 mg/cm$^3$, from 50 mg/cm$^3$ to 500 mg/cm$^3$, or from 100 mg/cm$^3$ to 500 mg/cm$^3$.

In certain examples, a smaller amount of transition metal can be dispensed to achieve surface conductivity, and a larger amount of transition metal can be applied to achieve bulk conductivity in the conductive composite. Thus, in some examples a smaller amount of conductive fusing agent composition can be printed on a single layer of polymer particles to form a resistor that has conductivity across the surface of the layer, i.e., in the x-y plane. In some examples, resistors with conductivity in the x-y plane can be formed with a mass of transition metal per volume of conductive composite that is greater than 1 mg/cm$^3$ or greater than 10 mg/cm$^3$. In further examples, such resistors can be formed with a mass of transition metal per volume of conductive composite from 1 mg/cm$^3$ to 1000 mg/cm$^3$, 10 mg/cm$^3$ to 500 mg/cm$^3$, or 30 mg/cm$^3$ to 200 mg/cm$^3$. However, such resistors may not have sufficient conductivity in the z-axis direction, or in other words, through the bulk of the layer. As used herein, the "z-axis" refers to the axis orthogonal to the x-y plane. For example, in 3-dimensional printing methods that use a powder bed that lowers after each layer is printed, the powder bed is lowered in the z-axis direction.

In some examples, a resistor that is conductive only in the x-y plane can be sufficient. This is the case when the resistor is formed parallel to the layers of the 3-dimensional printed part. However, methods according to the present technology can also be used to print resistors that are conductive in the z-axis direction. By dispensing a larger amount of conductive fusing agent composition onto the layer of polymer particles, the conductive fusing agent composition can penetrate through the layer and conductivity between layers in the z-axis direction can be achieved. In some examples, resistors that are conductive in the z-axis direction can be formed with a mass of transition metal per volume of conductive composite that is greater than 50 mg/cm$^3$ or greater than 100 mg/cm$^3$. In further examples, such resistors can be formed with a mass of transition metal per volume of conductive composite from 50 mg/cm$^3$ to 1000 mg/cm$^3$, 100 mg/cm$^3$ to 1000 mg/cm$^3$, or 140 mg/cm$^3$ to 500 mg/cm$^3$.

In some examples, the amount of transition metal dispensed onto the powder bed can be adjusted by printing the conductive fusing agent composition in multiple passes. In one example, a single pass of a fluid jet print head can be sufficient to dispense enough transition metal to achieve surface conductivity. However, in some cases, a single pass is not sufficient to achieve conductivity in the z-axis direction. Additional passes can be applied to increase the amount of transition metal in the transition metal composite, until a sufficient conductivity in the z-axis direction is achieved. In one example, three or more passes can be used to form a conductive composite with conductivity in the z-axis direction. In further examples, the amount of transition metal dispensed can be adjusted by adjusting the drop weight of the fluid jet printhead either through resistor design or by changing firing parameters. Thus, with a greater drop weight, a greater amount of the conductive fusing agent composition can be printed with each drop fired. However, in some cases jetting too large an amount of the composition in a single pass can lead to lower print quality because of spreading. Furthermore, adding a large amount of fluid in a single pass can be thermally disruptive, leading to excessive cooling of the print and part deformation due to polymer recrystallization. Therefore, in some examples multiple passes can be used to print a sufficient concentration of the conductive fusing agent composition with better print quality. This can also prevent excessive part cooling and avoid part deformation.

In a particular example, a 3-dimensional printed part can be formed as follows. A fluid jet printer can be used to print a first pass including printing a conductive fusing agent composition onto a first portion of the powder bed and printing a second fusing agent composition onto a second portion of the powder bed. A curing pass can then be performed by passing a fusing lamp over the powder bed to fuse the polymer particles and sinter transition metal particles in the conductive fusing agent composition. Then, one or more additional passes can be performed of printing the conductive fusing agent composition onto the first portion of the powder bed to increase the amount of transition metal. Each pass of printing the conductive fusing agent composition can be followed by a curing pass with the fusing lamp. In another example, multiple passes of printing the conductive fusing agent composition onto a powder layer without fully fusing the powder layer between printed passes. This can allow the conductive fusing agent so saturate the polymer powder before the powder layer becomes fused. The number of passes used can depend on the desired conductivity, the contone level of the printing passes (referring to the density of conductive fusing agent composition per area deposited on each pass), the type of transition metal in the conductive fusing agent composition, concentration of transition metal in the conductive fusing agent composition, thickness of the layer of polymer powder being printed, and so on.

Accordingly, the methods of the present technology can be used to make 3-dimensional printed parts with integrated temperature sensors that are oriented in any direction. As explained above, a resistor can be formed in the x-y plane with respect to the layers of the 3-dimensional printed part using a relatively smaller amount of conductive fusing agent composition, while resistors oriented in the z-axis direction can be formed by using a relatively greater amount of conductive fusing agent composition on each layer. In one example, the resistor can be oriented at least partially in the z-axis direction with respect to the layers of the 3-dimensional printed part. As used herein, "at least partially in the z-axis direction" refers to any direction that has at least a non-zero component on the z-axis. Therefore, resistors can be formed parallel to the z-axis or diagonal to the z-axis using the methods described herein.

The 3-dimensional printing methods described herein can be used to manufacture a wide variety of complex part shapes. The resistors printed as integrated temperature sensors can similarly have a wide variety of shapes. In some examples, the resistor can have a serpentine shape with multiple turns along the length of the resistor. In some cases, increasing the length of the resistor can increase the overall resistance. Other resistor shapes can also be used.

3-dimensional printed parts can also be made with multiple integrated resistors. For example, multiple resistors can be included to measure temperature on multiple portions of the part.

It is noted that, as used in this specification and the appended claims, the singular forms "a," "an," and "the" include plural referents unless the context clearly dictates otherwise.

As used herein, "liquid jetting vehicle," "liquid vehicle" or "ink vehicle" refers to a liquid fluid in which fusing agents can be placed to form jettable fusing agent compositions. Colorants can also be added to liquid jetting vehicles to form colored inks. A wide variety of vehicles may be used with the systems and methods of the present disclosure. Such vehicles may include a mixture of a variety of different agents, including, surfactants, solvents, co-solvents, anti-kogation agents, buffers, biocides, sequestering agents, viscosity modifiers, surface-active agents, water, etc. Though not part of the liquid vehicle per se, in addition to the colorants and fusing agents, the liquid vehicle can carry solid additives such as polymers, latexes, UV curable materials, plasticizers, salts, etc.

As used herein, "colorant" can include dyes and/or pigments.

As used herein, "dye" refers to compounds or molecules that absorb electromagnetic radiation or certain wavelengths thereof. Dyes can impart a visible color to an ink if the dyes absorb wavelengths in the visible spectrum.

As used herein, "pigment" generally includes pigment colorants, magnetic particles, aluminas, silicas, and/or other ceramics, organo-metallics or other opaque particles, whether or not such particulates impart color. Thus, though the present description primarily exemplifies the use of pigment colorants, the term "pigment" can be used more generally to describe not only pigment colorants, but other pigments such as organometallics, ferrites, ceramics, etc. In one specific aspect, however, the pigment is a pigment colorant.

As used herein, "soluble," refers to a solubility percentage of more than 5 wt %.

As used herein, "fluid jetting" or "jetting" refers to compositions that are ejected from fluid jetting architecture, such as ink-jet architecture. Fluid jetting architecture can include thermal or piezo architecture. Additionally, such architecture can be configured to print varying drop sizes such as less than 10 picoliters, less than 20 picoliters, less than 30 picoliters, less than 40 picoliters, less than 50 picoliters, etc.

As used herein, the term "substantial" or "substantially" when used in reference to a quantity or amount of a material, or a specific characteristic thereof, refers to an amount that is sufficient to provide an effect that the material or characteristic was intended to provide. The exact degree of deviation allowable may in some cases depend on the specific context.

As used herein, the term "about" is used to provide flexibility to a numerical range endpoint by providing that a given value may be "a little above" or "a little below" the endpoint. The degree of flexibility of this term can be dictated by the particular variable and determined based on the associated description herein.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include individual numerical values or sub-ranges encompassed within that range as if each numerical value and sub-range is explicitly recited. As an illustration, a numerical range of "about 1 wt % to about 5 wt %" should be interpreted to include not only the explicitly recited values of about 1 wt % to about 5 wt %, but also include individual values and sub-ranges within the indicated range. Thus, included in this numerical range are individual values such as 2, 3.5, and 4 and sub-ranges such as from 1-3, from 2-4, and from 3-5, etc. This same principle applies to ranges reciting only one numerical value. Furthermore, such an interpretation should apply regardless of the breadth of the range or the characteristics being described.

EXAMPLE

The following illustrates an example of the present disclosure. However, it is to be understood that the following is only illustrative of the application of the principles of the present disclosure. Numerous modifications and alternative compositions, methods, and systems may be devised without departing from the spirit and scope of the present disclosure. The appended claims are intended to cover such modifications and arrangements.

Example 1

A 3-dimensional printing system was used to print a temperature sensor with a serpentine shaped resistor embedded in a rectangular polymer strip. A conductive fusing agent composition, pretreat composition, and second fusing agent composition were printed from three separate ink jet slots. The conductive fusing agent composition was a silver ink (Mitsubishi NBSIJ-MU01) containing silver nanoparticles. The silver nanoparticles had an average particle size of approximately 20 nm. The pretreat composition was a solution of 3 wt % sodium chloride in water. The second fusing agent composition included carbon black as the fusing agent and an aqueous vehicle.

The fusing agent compositions and pretreat composition were jetted onto a bed of nylon (PA12) particles (Vestosint® x1556). The nylon particles had an average particle size of approximately 50 μm. The layer thickness was approximately 100 μm. Each layer was printed with the pretreat composition followed by the conductive fusing agent composition in the portions that make up the resistor, and the carbon black fusing agent composition in the insulating portions. The compositions were printed at contone levels of 255 for the conductive fusing agent composition, 255 for the pretreat composition, and 15 for the carbon black fusing agent composition. Three (3) passes of the compositions were performed for each layer. After each pass with the compositions, a curing pass was performed. In this example, the amount of solid silver dispensed onto the powder was 141 mg/cm³ of the powder layer; the amount of chloride salt dispensed was 23 mg/cm³ of the powder layer; and the amount of carbon black dispensed was 2.3 mg/cm³ of the powder layer.

The printer powder supply and powder bed were filled with the nylon particles. The supply temperature was set at 110° C. and the print bed temperature was set at 130° C. A heater under the print bed was set at 150° C. The print speed was set at 10 inches per second (ips) and the cure speed was set at 7 ips. Curing was performed using two 300 W bulbs placed approximately 1 cm away from the surface of the powder bed.

Figure 7:
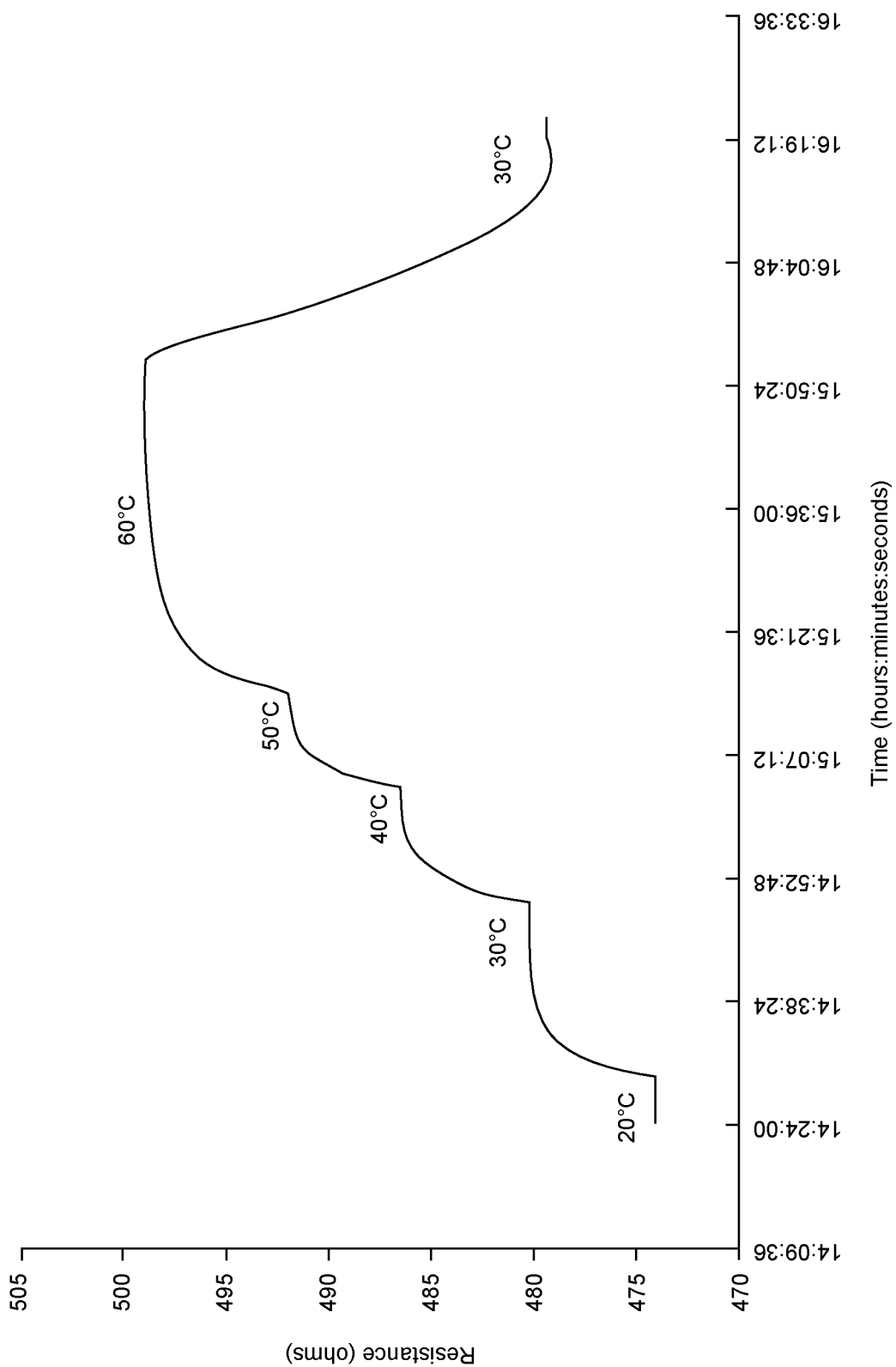
FIG. 7 is a graph of resistance vs. time for a 3-dimensional printed temperature sensor at a variety of temperatures in accordance with examples of the present disclosure.

After printing the temperature sensor, the temperature sensor was wired to a HP® 34401 digital multimeter using silver epoxy to create a permanent bond with the sensor contacts. The temperature sensor was placed in a temperature controlled Thermotron® SE 2000 oven. The temperature of the oven was ramped from 20° C. to 30° C., 40° C., 50° C., 60° C., and then back to 30° C. The resistance of the temperature sensor as measured by the digital multimeter is plotted in FIG. 7. The results show that the resistance of the 3-dimensional printed temperature sensor has a positive correlation with temperature.

What is claimed is:

1. A temperature sensor, comprising:
   a resistor formed of a matrix of sintered elemental transition metal particles interlocked with a matrix of fused thermoplastic polymer particles, wherein the resistor has a positive temperature coefficient of resistance;
   a first electrical contact at a first end of the resistor;
   a second electrical contact at a second end of the resistor; and
   a resistance measuring device connected to the first electrical contact and the second electrical contact to measure a resistance of the resistor.

2. The temperature sensor of claim 1, wherein the elemental transition metal particles comprise silver particles, copper particles, gold particles, or combinations thereof.

3. The temperature sensor of claim 1, wherein the matrix of fused thermoplastic polymer particles comprises a fusing agent selected from carbon black, a near-infrared absorbing dye, a near-infrared absorbing pigment, a tungsten bronze, a molybdenum bronze, metal nanoparticles, a conjugated polymer, or combinations thereof.

4. The temperature sensor of claim 1, wherein the resistor further comprises a halogen salt in the matrix of sintered elemental transition metal particles; the matrix of fused thermoplastic polymer particles, or both.

5. The temperature sensor of claim 1, wherein the resistor has a resistance from 1 ohm to 1 Mega ohm.

6. A 3-dimensional printed part having an integrated temperature sensor, comprising:
   a part body formed of fused thermoplastic polymer particles;
   a resistor formed of a matrix of sintered elemental transition metal particles interlocked with a matrix of fused thermoplastic polymer particles, wherein the matrix of fused thermoplastic polymer particles is continuously fused to the fused thermoplastic polymer particles of the part body, and wherein the resistor has a positive temperature coefficient of resistance;
   a first electrical contact at a first end of the resistor;
   a second electrical contact at a second end of the resistor; and
   a resistance measuring device connected to the first electrical contact and the second electrical contact to measure a resistance of the resistor.

7. The 3-dimensional printed part of claim 6, wherein the elemental transition metal particles comprise silver particles, copper particles, gold particles, or combinations thereof.

8. The 3-dimensional printed part of claim 6, wherein the fused thermoplastic polymer particles comprise a fusing agent selected from carbon black, a near-infrared absorbing dye, a near-infrared absorbing pigment, a tungsten bronze, a molybdenum bronze, metal nanoparticles, a conjugated polymer, or combinations thereof.

9. The 3-dimensional printed part of claim 6, wherein the resistor further comprises a halogen salt in the matrix of sintered elemental transition metal particles, the matrix of fused thermoplastic polymer particles, or both.

10. The 3-dimensional printed part of claim 6, wherein the resistor has a resistance from 1 ohm to 1 Mega ohm.

11. The 3-dimensional printed part of claim 6, wherein the resistor is embedded in the part body.

12. The 3-dimensional printed part of claim 6, wherein the part is formed of multiple layers of fused thermoplastic polymer particles stacked in a z-axis direction, and wherein the resistor is oriented at least partially in the z-axis direction.

13. A method of making a 3-dimensional printed part having an integrated temperature sensor, the method comprising:
   dispensing a conductive fusing agent composition onto a first area of a layer of thermoplastic polymer particles, wherein the conductive fusing agent composition comprises a transition metal and a first liquid jetting vehicle;
   dispensing a second fusing agent composition onto a second area of the layer of thermoplastic polymer particles, wherein the second fusing agent composition comprises a second liquid jetting vehicle and a fusing agent capable of absorbing electromagnetic radiation to produce heat;
   fusing the first and second areas with electromagnetic radiation to form a resistor in the first area and a part body in the second area, wherein the resistor comprises a matrix of sintered transition metal particles interlocked with a matrix of fused thermoplastic polymer particles, and the part body comprises fused thermoplastic polymer particles, and wherein the resistor has a positive temperature coefficient of resistance; and
   connecting a resistance measuring device to the resistor to measure a resistance of the resistor.

14. The method of claim 13, wherein the resistor is embedded in the part body.

15. The method of claim 13, wherein the transition metal is in the form of elemental transition metal particles.

* * * * *